(12) United States Patent
Kobayashi et al.

(10) Patent No.: US 7,767,054 B2
(45) Date of Patent: Aug. 3, 2010

(54) PLASMA PROCESSING APPARATUS

(75) Inventors: Hiroyuki Kobayashi, Kodaira (JP);
Masaru Izawa, Hino (JP); Kenetsu Yokogawa, Tsurugashima (JP);
Tomoyuki Tamura, Kudamatsu (JP);
Kenji Maeda, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 836 days.

(21) Appl. No.: 11/213,737

(22) Filed: Aug. 30, 2005

(65) Prior Publication Data

US 2006/0254717 A1    Nov. 16, 2006

(30) Foreign Application Priority Data

May 11, 2005    (JP)    ............... 2005-138519

(51) Int. Cl.
    *C23F 1/00*    (2006.01)
(52) U.S. Cl. .............................. 156/345.3; 156/345.38; 156/345.48
(58) Field of Classification Search ............ 156/345.38, 156/345.47, 345.48, 345.54, 345.3, 44, 47, 156/48, 54; 118/723 E, 723 ER, 723 I
    See application file for complete search history.

(56) References Cited

U.S. PATENT DOCUMENTS

| | | | | |
|---|---|---|---|---|
| 5,685,942 | A * | 11/1997 | Ishii | ....................... 156/345.48 |
| 6,059,985 | A * | 5/2000 | Yoshimura et al. | ............ 216/37 |
| 6,225,233 | B1 * | 5/2001 | Seo et al. | .................... 438/716 |
| 6,830,622 | B2 * | 12/2004 | O'Donnell et al. | ..... 156/345.51 |
| 7,311,784 | B2 * | 12/2007 | Fink | ......................... 118/728 |
| 7,311,797 | B2 * | 12/2007 | O'Donnell et al. | ..... 156/345.51 |
| 2003/0201069 | A1 * | 10/2003 | Johnson | .................. 156/345.43 |
| 2004/0261946 | A1 * | 12/2004 | Endoh et al. | ........... 156/345.15 |
| 2005/0164506 | A1 * | 7/2005 | Chen et al. | ................... 438/689 |
| 2006/0096703 | A1 * | 5/2006 | Moriya et al. | .......... 156/345.19 |
| 2006/0201623 | A1 * | 9/2006 | Yoo | ........................ 156/345.3 |
| 2006/0273733 | A1 * | 12/2006 | Honda et al. | ........... 315/111.21 |
| 2007/0169891 | A1 * | 7/2007 | Koshiishi et al. | ........ 156/345.47 |

FOREIGN PATENT DOCUMENTS

| | | | |
|---|---|---|---|
| DE | 10-143719 | * | 3/2003 |
| JP | 03-097869 | | 4/1991 |
| JP | 05-140771 | | 6/1993 |
| JP | 9-283459 | | 10/1997 |
| JP | 2000-183038 | | 6/2000 |
| JP | 2004-200219 | | 7/2004 |
| JP | 2004-200353 | * | 7/2004 |
| JP | 2005-064460 | | 3/2005 |
| WO | WO 03/075334 | | 9/2003 |

* cited by examiner

*Primary Examiner*—Lan Vinh
(74) *Attorney, Agent, or Firm*—Antonelli, Terry, Stout & Kraus, LLP.

(57) ABSTRACT

A plasma processing apparatus includes a vacuum processing chamber, supplying means for introducing a processing gas into the vacuum processing chamber, a mounting electrode in the vacuum processing chamber for mounting a specimen on the mounting electrode, and a pusher pin for raising the specimen placed on the mounting electrode and holding the specimen over the mounting electrode, wherein the mounting electrode includes an inner area for mounting the specimen, an outer area for mounting a focus ring, and a high-frequency power source for supplying electric power to the inner area and the outer area, and wherein high-frequency electric power is applied to the outer area to generate plasma at the outer edge of the backside of the specimen while the specimen is raised with the pusher pin.

12 Claims, 12 Drawing Sheets

000
PLASMA PROCESSING APPARATUS

The present application is based on and claims priority of Japanese patent application No. 2005-138519 filed on May 11, 2005, the entire contents of which are hereby incorporated by reference.

BACKGROUND OF THE INVENTION

1. Field of the Invention

The present invention relates to a plasma processing apparatus, and more particularly to a plasma processing apparatus including a mechanism for cleaning the outer edge of the backside of a specimen.

2. Description of the Related Art

In a process for manufacturing a semiconductor device, such as a DRAM or a microprocessor, plasma etching, plasma CVD, and plasma ashing utilizing a weakly ionized plasma are widely used. To improve the yield in the manufacturing process of the semiconductor device, it is important to reduce particles adhering to the specimen during the plasma processing.

In recent years, as semiconductor devices have been downsized, processing gases that tend to build up a deposition layer on a specimen have been used more frequently. However, the use of such processing gases generates a deposited film on the outer edge of the backside of the specimen in the plasma processing. The deposited film may peel off to become matters adhering to the specimen, for example, during the transfer of the specimen.

Figure 12:
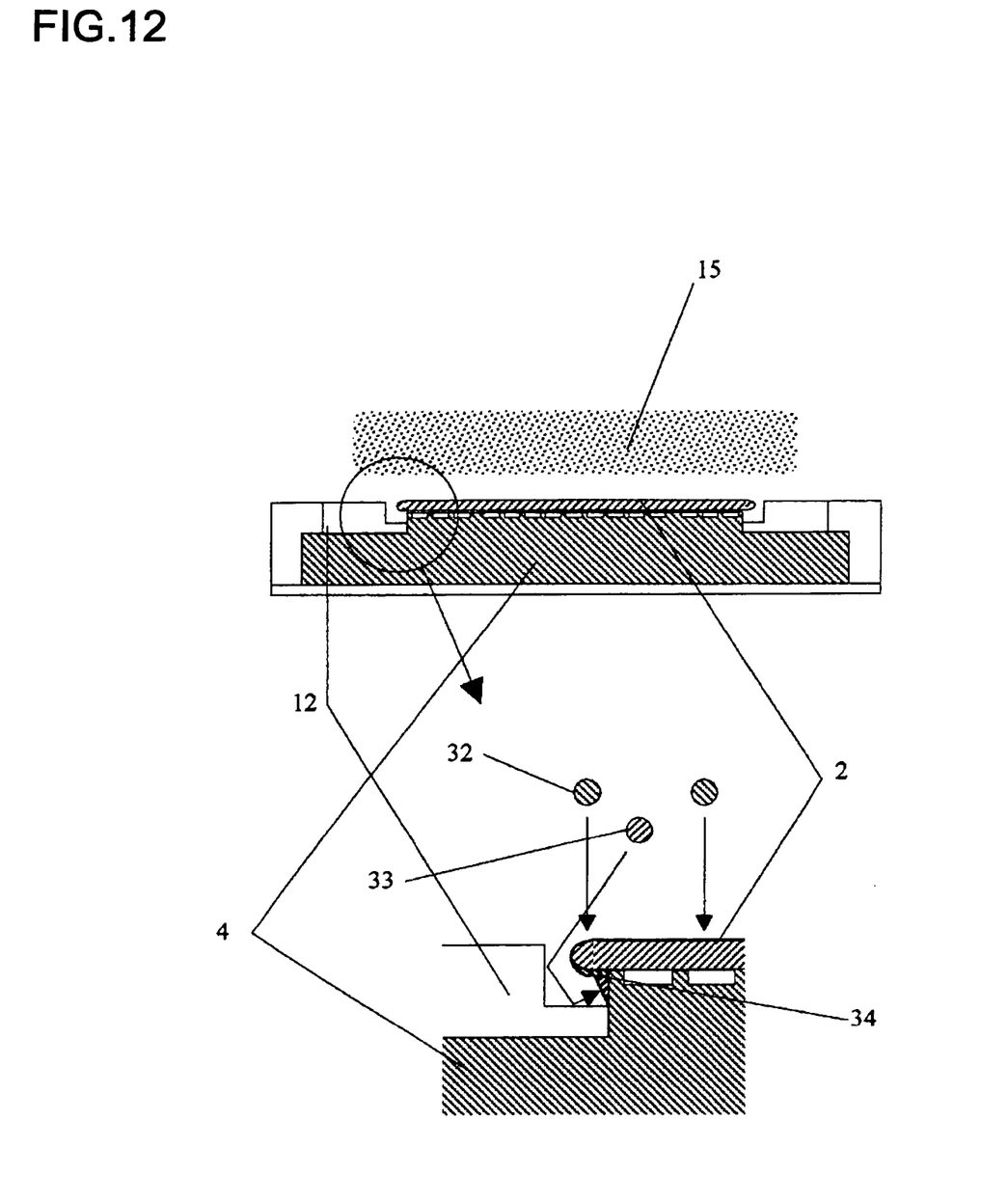
FIG. 12 is a schematic view illustrating a mechanism by which a deposited film is formed on the outer edge of the backside of a specimen.

FIG. 12 illustrates a mechanism by which deposits are formed on the outer edge of the backside of the specimen 2 on a mounting electrode 4. The specimen 2 is mounted on a specimen-mounting face of the mounting electrode 4 such that about 1 to 2 mm of the edge of the specimen 2 extends past the edge of the mounting electrode 4. This prevents the wearing out of the top face of the mounting electrode 4 due to the impact of incident plasma particles. In other words, because ions 32 generated in plasma 15 collide with the specimen 2 at right angles, the ions 32 can hardly collide with the edge of the backside of the specimen 2 that extends past the mounting electrode 4, that is, a portion hidden behind the specimen 2 from the plasma 15.

However, neutral particles 33 in the plasma 15 collide with the specimen 2 and a focus ring 12 at different angles. Some of the neutral particles bounced off the specimen 2 and the mounting electrode 4 finally collide with the portion hidden behind the specimen 2 from the plasma 15. Thus, the neutral particles, which tend to build up on the specimen 2, adhere to the outer edge of the backside of the specimen 2. The adhering neutral particles are not removed by incident ions and thus grow into a thick deposited film 34.

Methods for removing the deposited film on the outer edge of the backside of the specimen and measures for preventing the formation of the deposited film have been proposed. For example, Japanese Unexamined Patent Application Publication No. 2004-200353 discloses a method for preventing the formation of a deposited film around a substrate specimen. This method comprises feeding a gas that reacts with and thereby eliminates the deposited film into the periphery of the back side of the substrate specimen.

Japanese Unexamined Patent Application Publication No. 2004-200219 also discloses a method for preventing the formation of a deposited film on the outer edge of a specimen. This method comprises performing plasma processing while the outer edge of the specimen is protected with a cover. Japanese Unexamined Patent Application Publication No. 9-283459 discloses a method for removing a deposited film on the backside of a specimen. This method comprises generating cleaning plasma between a mounting electrode and the specimen while the specimen is raised from the mounting electrode.

In the method according to the Japanese Unexamined Patent Application Publication No. 2004-200353, the gas that eliminates the deposited film diffuses into a processing chamber and may cause deterioration of a film on the specimen or erosion of a micropattern. In the method according to the Japanese Unexamined Patent Application Publication No. 9-283459, the plasma wears a specimen-mounting face of the mounting electrode. In the method according to the Japanese Unexamined Patent Application Publication No. 2004-200219, an electric field around the outer edge of the specimen may be distorted in a manner that depends on the geometry of the protective cover. The distorted electric field changes incident angles of ions and causes the deformation of a finished shape of the outer edge of the specimen, for example, in an etching apparatus. Thus, it is not always desirable to put the protective cover on the outer edge of the specimen during the plasma processing.

Considering these problems, the present invention provides a plasma processing apparatus that can efficiently remove a deposited film on the outer edge of the backside of a specimen.

The present invention employs the following means to solve the problems described above.

SUMMARY OF THE INVENTION

Accordingly, it is an object of the present invention to provide a plasma processing apparatus includes a vacuum processing chamber, supplying means for introducing a processing gas into the vacuum processing chamber, a mounting electrode in the vacuum processing chamber for mounting a specimen on the mounting electrode, and a pusher pin for raising the specimen placed on the mounting electrode and holding the specimen over the mounting electrode, wherein the mounting electrode includes an inner area for mounting the specimen, an outer area for mounting the focus ring, and a high-frequency power source for supplying electric power to the inner area and the outer area, and wherein high-frequency electric power is applied to the outer area to generate plasma at the outer edge of the backside of the specimen while the specimen is raised with the pusher pin.

The plasma processing apparatus according to the present invention has the structure described above and can efficiently remove a deposited film on the outer edge of the backside of a specimen without adversely affecting other portions.

DESCRIPTION OF THE PREFERRED EMBODIMENTS

Figure 1:
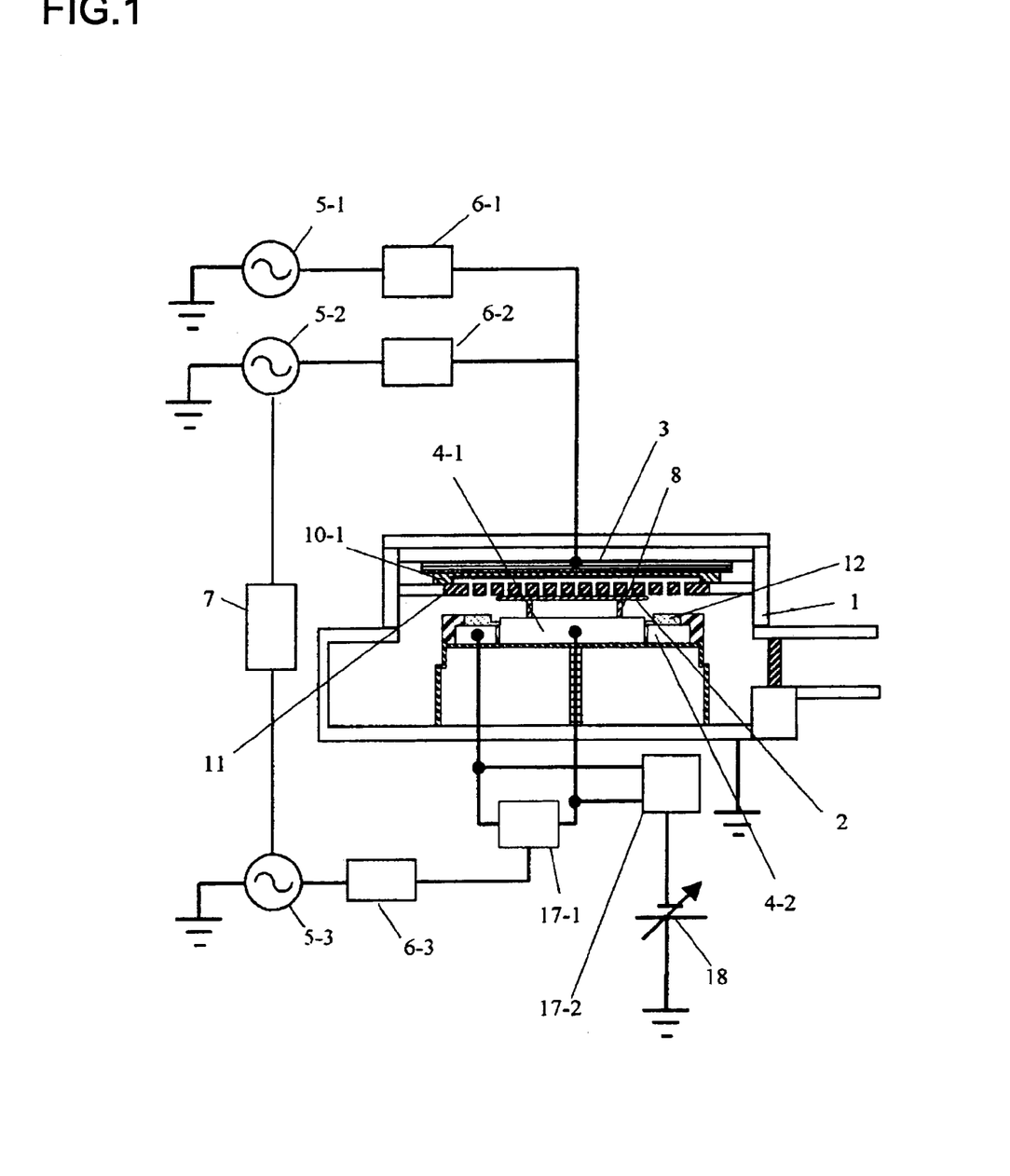
FIG. 1 is a schematic view of a plasma processing apparatus according to a first embodiment of the present invention.

Preferred embodiments of the present invention will be described below with reference to the accompanying drawings. FIG. 1 is a schematic view of a plasma processing apparatus according to a first embodiment of the present invention. In FIG. 1, the present invention is applied to a parallel-plate ECR plasma processing apparatus.

As shown in FIG. 1, in a vacuum processing chamber 1, a generally discoidal antenna electrode 3 for electromagnetic radiation and a mounting electrode 4 (an inner area 4-1 and an outer area 4-2) for mounting a specimen 2 face each other in parallel. A first high-frequency power source 5-1 for generating plasma is coupled to the antenna electrode 3 through a first matching transformer 6-1. The frequency of the first high-frequency power source 5-1 is, for example, in the range of 100 to 500 MHz. A coil (not shown) and a yoke (not shown) are disposed outside the vacuum processing chamber 1 and generate a magnetic field. The resulting magnetic field increases the efficiency of plasma production. In addition, the distribution of plasma can be controlled by regulating the distribution of the magnetic field.

A gas distributor 10-1 is disposed under the antenna electrode 3. A silicon shower plate 11 is disposed under the gas distributor 10-1. A processing gas is radially dispersed by the gas distributor 10-1 and is introduced into the vacuum processing chamber 1 through holes in the shower plate 11. For example, the shower plate 11 has several hundred of holes with about 10 mm pitches in an area having a diameter of 300 mm, and the diameter of the holes is 0.5 mm.

In addition to the first high-frequency power source 5-1 for generating plasma, a second high-frequency power source 5-2 for applying bias electric power to the antenna electrode 3 is coupled to the antenna electrode 3 through a second matching transformer 6-2. The reaction between silicon in the shower plate 11 and a radical, in particular a fluorine radical in the plasma can be controlled by regulating the bias electric power applied to the antenna electrode 3. Thus, the spatial distribution of radicals can be controlled.

To control ion flux or energy incident on the specimen 2, a third high-frequency power source 5-3 is coupled to the mounting electrode 4 through a third matching transformer 6-3. High-frequency electric power output from the third high-frequency power source 5-3 has a frequency of at least 1 MHz. When the third high-frequency power source 5-3 has the frequency in this range, the high-frequency electric power applied to the mounting electrode 4 can generate plasma by itself. Furthermore, to control the plasma production and the ion energy incident on the mounting electrode 4 individually, the frequency of the high-frequency electric power output from the third high-frequency power source 5-3 is less than about one-fourth of the frequency of the first high-frequency power source 5-1 for generating plasma.

The second high-frequency power source 5-2 coupled to the antenna electrode 3 has the same frequency as the third high-frequency power source 5-3 coupled to the mounting electrode 4. The phase difference between the second high-frequency power source 5-2 and the third high-frequency power source 5-3 can be controlled with a phase controller 7. For example, when the phase difference is 180 degrees, plasma confinement is improved and accordingly the ion flux and the energy incident on the side wall of the vacuum processing chamber 1 decrease. Thus, the wearing away of the side wall is reduced. On the other hand, when the phase difference is 0 degrees, the ion flux and the energy incident on the side wall increase. Thus, the inner wall of the vacuum processing chamber 1 can be cleaned with oxygen or other plasmas at high speeds.

A focus ring 12 is mounted on the outer area 4-2. A first electric power distributor 17-1 divides the electric power output from the third high-frequency power source 5-3 into two portions: one portion is supplied to the inner area 4-1 for mounting the specimen 2 and the other portion is supplied to the outer area 4-2 for mounting the focus ring 12. The first electric power distributor 17-1 can control the ratio between the high-frequency electric power applied to the inner area 4-1 and that applied to the outer area 4-2. Thus, the electric powers applied to the inner area 4-1 and the outer area 4-2 can be independently controlled with the first electric power distributor 17-1 in combination with the power adjustment by the third high-frequency power source 5-3. The specimen 2 can be raised over the inner area 4-1 with a pusher pin 8.

Figure 2:
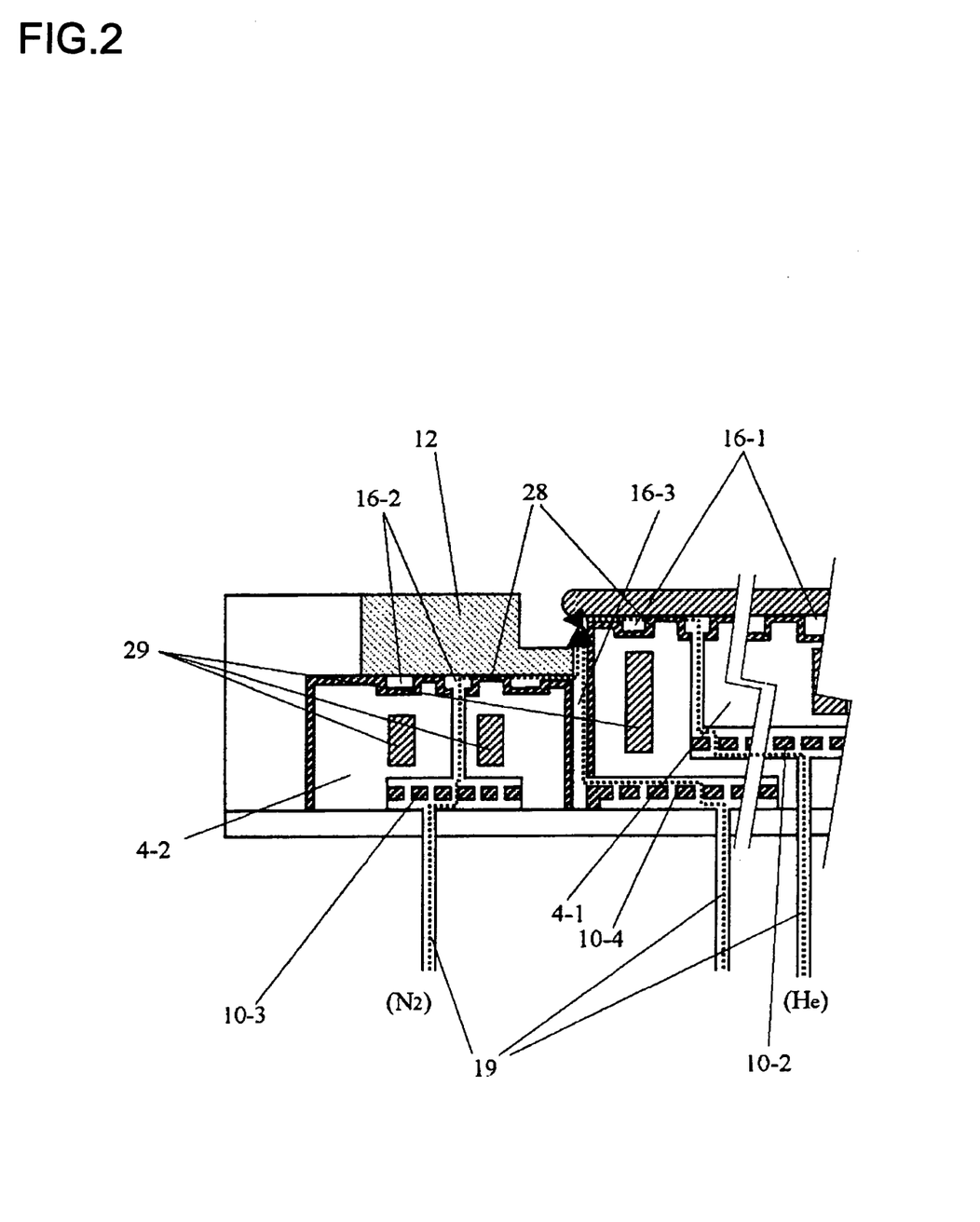
FIG. 2 is a detail view of a mounting electrode in the plasma processing apparatus according to the first embodiment of the present invention.

FIG. 2 is a detail view of the mounting electrode 4. When high-frequency electric power is applied to the focus ring 12 through the outer area 4-2 to generate plasma, heat flux of the plasma is concentrated on the focus ring 12 and thereby superheats the focus ring 12. The superheat of the focus ring 12 may damage the focus ring 12 because of thermal stress or may accelerate the wearing out of the focus ring 12.

To prevent the superheat, the mounting face of the outer area 4-2 is provided with a second coolant passage 16-2 for cooling the focus ring 12. Examples of the coolant include helium, oxygen, and nitrogen. The coolant flows out from the inner edge side of the focus ring 12.

The focus ring 12 can be electrostatically fixed to the outer area 4-2 so as not to be raised from the outer area 4-2 by the pressure of the coolant. The mounting electrode 4 is based, for example, on aluminum, which is covered with a spray deposit 28, such as alumina, anodized aluminum, or yttria.

As shown in FIG. 1, the electric power output from a direct-current power source 18 for electrostatically fixing the specimen 2 on the inner area 4-1 is divided into two portions with a second electric power distributor 17-2: one portion is supplied to the inner area 4-1 and the other portion is supplied to the outer area 4-2. The second electric power distributor 17-2 can control the ratio between the electric power applied to the inner area 4-1 and the electric power applied to the outer area 4-2 and their polarities. Thus, the second electric power distributor 17-2 can electrostatically fix the specimen 2 and the focus ring 12 independently on the mounting electrode 4.

To control the temperature at the inside of the specimen 2 and the temperature at the outer edge of the specimen 2 independently, the specimen-mounting face of the inner area 4-1 is designed such that gases different in flow rate or composition are independently supplied to the inside of the specimen 2 and the outer edge of the specimen 2. Furthermore, the inner area 4-1 has a first coolant passage 16-1 in the outer edge of the specimen-mounting face such that the coolant for the specimen 2 flows out near the outer edge of the backside of the specimen 2.

A third coolant passage 16-3 is provided between the inner area 4-1 and the outer area 4-2. A large amount, for example, 1000 cc/min of coolant can be supplied to the outer edge of the backside of the specimen 2 through this third coolant passage 16-3. Gas distributors 10-2, 10-3, and 10-4 are provided in the mounting electrode 4 to achieve circumferentially uniform supply of the coolant to the backside of the specimen 2, the backside of the focus ring 12, and the outer edge of the backside of the specimen 2.

Figure 3:
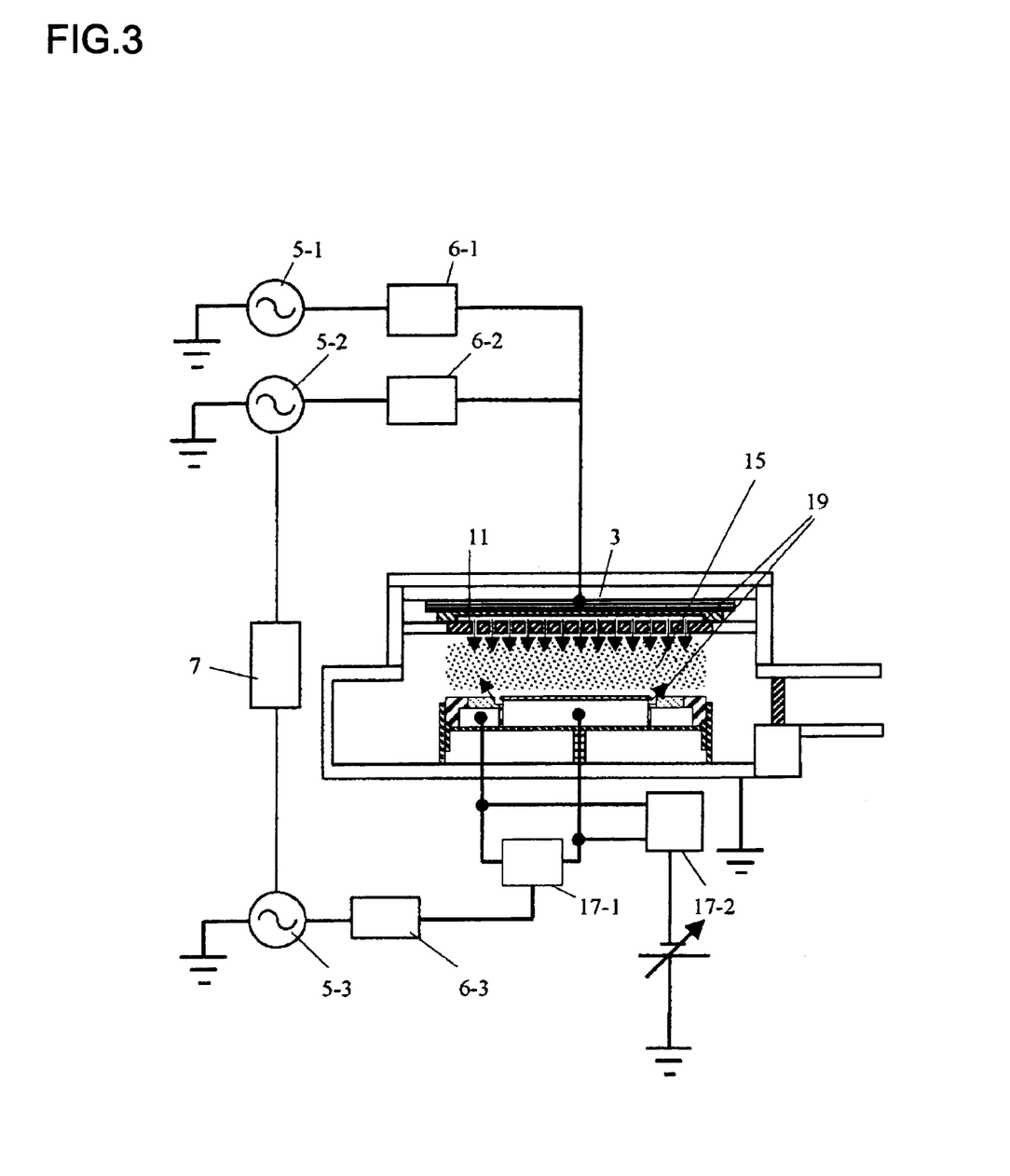
FIG. 3 is a schematic view illustrating an etching process with the plasma processing apparatus according to the first embodiment of the present invention.

FIG. 3 is a schematic view illustrating an etching process with the plasma processing apparatus according to the first embodiment of the present invention. Plasma 15 is generated by the electric power of the first high-frequency power source 5-1, which is coupled to the antenna electrode 3 and generates plasma. High-frequency bias electric power is applied to the antenna electrode 3 and the mounting electrode 4 with the second high-frequency power source 5-2 and the third high-frequency power source 5-3, respectively. To electrostatically fix the focus ring 12 and the specimen 2 on the mounting electrode 4, the electric power output from the direct-current power source 18 is divided into two portions with the second electric power distributor 17-2: one portion is supplied to the inner area 4-1 and the other portion is supplied to the outer area 4-2.

A processing gas is supplied through the shower plate 11. For example, the processing gas is a mixture of $CHF_3$ and nitrogen. The coolants are helium for the specimen 2 and nitrogen for the focus ring 12. After cooling the focus ring 12, the nitrogen gas flows out near the outer edge of the backside of the specimen 2, as indicated by an arrow 19, thus increasing the nitrogen partial pressure in this area. The increased nitrogen partial pressure reduces the amount of deposited film on the outer edge of the backside of the specimen 2. Furthermore, helium flowing out near the outer edge of the specimen 2 increases the pressure around the outer edge of the backside of the specimen 2. This increased pressure prevents radicals that tend to deposit on the outer edge of the specimen 2 from flowing into this area. These effects contribute to the reduction in the amount of deposited film on the outer edge of the backside of the specimen 2.

Figure 4:
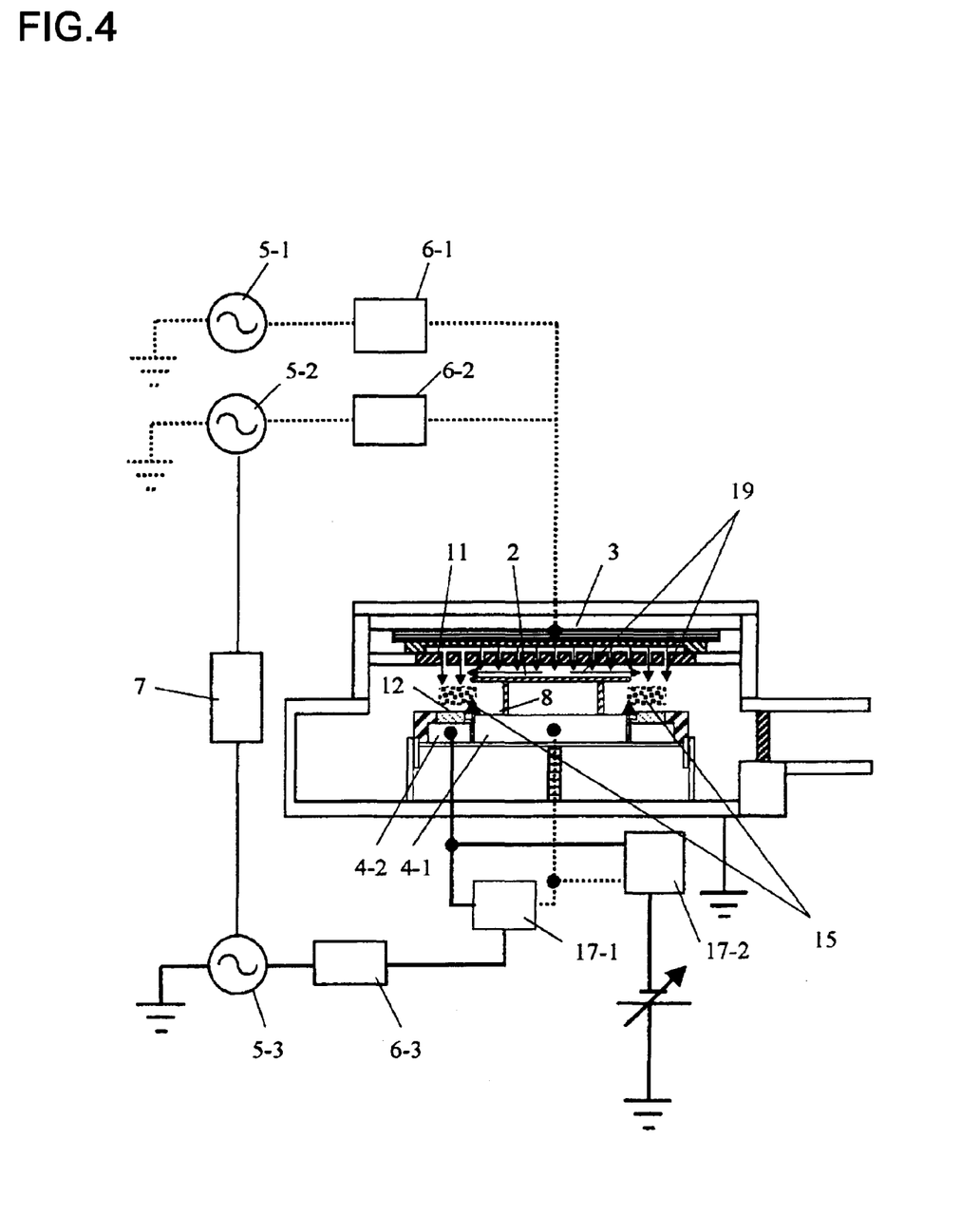
FIG. 4 is a schematic view illustrating a cleaning process with the plasma processing apparatus according to the first embodiment of the present invention.

FIG. 4 is a schematic view illustrating a cleaning process with the plasma processing apparatus according to the first embodiment of the present invention. The outer edge of the backside of the specimen 2 is cleaned after the etching process. During the cleaning, the specimen 2 is raised with the pusher pin 8 and thereby a predetermined space is provided between the specimen 2 and the inner area 4-1. The mounting electrode 4 is raised to bring the specimen 2 close to the shower plate 11.

Then, oxygen is supplied through the shower plate 11, as indicated by an arrow 19. Oxygen is also used as the coolant for the focus ring 12. Furthermore, oxygen is further supplied through the third coolant passage 16-3 between the inner area 4-1 and the outer area 4-2 (see FIG. 2). High-frequency electric power output from the third high-frequency power source 5-3 is applied to the focus ring 12 to generate an oxygen plasma 15 between the focus ring 12 and the outer edge of the backside of the specimen 2. The oxygen plasma 15 can remove the deposited film on the outer edge of the backside of the specimen 2. Furthermore, when the mounting electrode 4 is raised to bring the specimen 2 close to the shower plate 11, the oxygen from the shower plate 11 prevents the plasma and reactive radicals from entering the space between the specimen 2 and the shower plate 11. This reduces damage to the top face of the specimen 2 during the cleaning.

Figure 5:
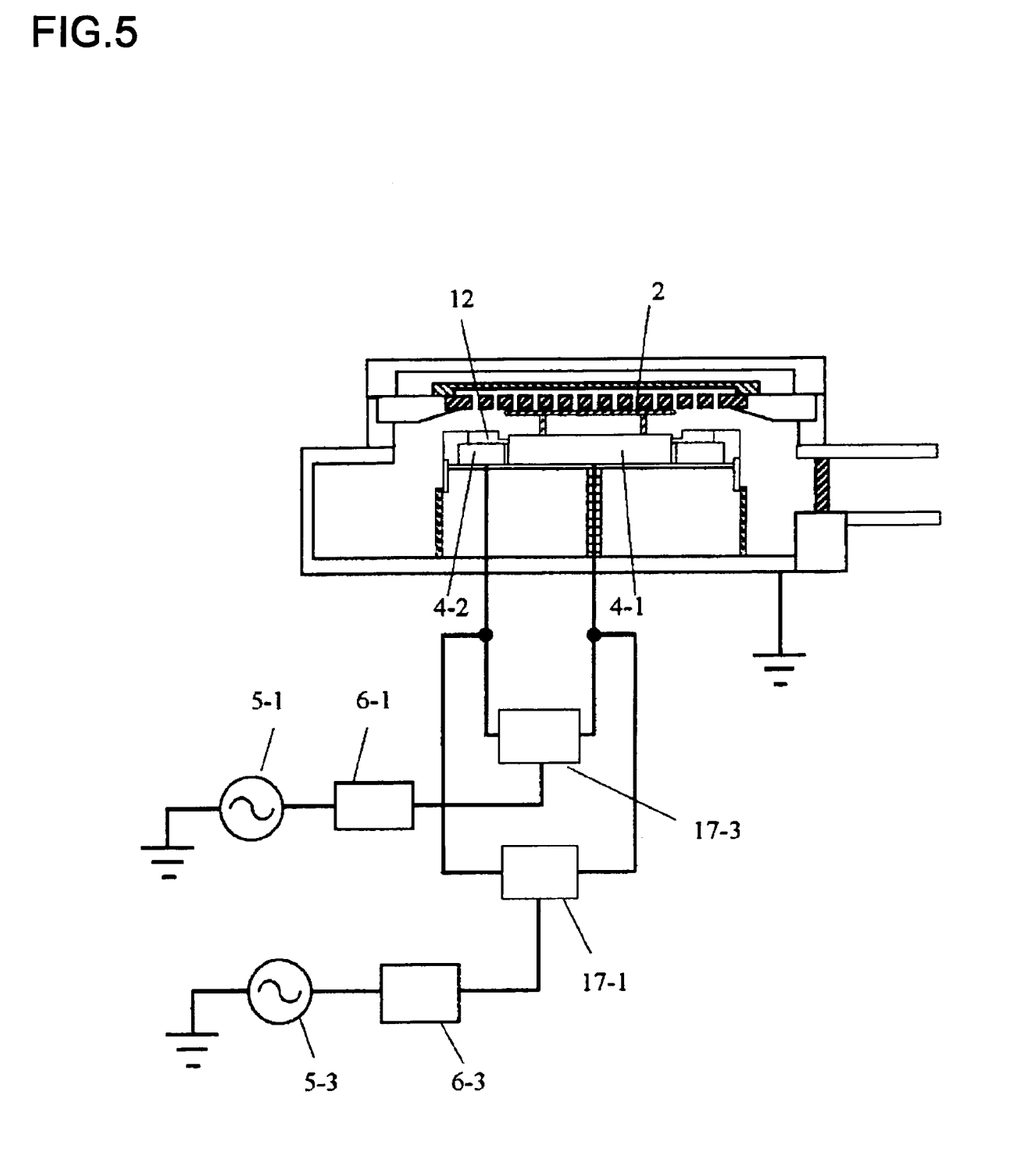
FIG. 5 is a schematic view of a plasma processing apparatus according to a second embodiment of the present invention.

FIG. 5 is a schematic view of a plasma processing apparatus according to a second embodiment of the present invention. In this embodiment, the present invention is applied to a plasma processing apparatus in which both a first high-frequency power source 5-1 for generating plasma and a third high-frequency power source 5-3 for accelerating ions incident on a specimen 2 are coupled to a mounting electrode 4. The same components as in FIG. 1, such as a direct-current power source 18 for electrostatically fixing the specimen 2 on the inner area 4-1, will not be further explained.

When the outer edge of the backside of the specimen 2 is cleaned, the electric power from the first high-frequency power source 5-1 can be applied to the outer area 4-2 to generate annular plasma (cleaning plasma) along the outer edge of the backside of the specimen 2. In this embodiment, since high-frequency electric power for generating plasma can be applied to a focus ring 12, the density and the gas pressure of the cleaning plasma can be controlled with a high degree of flexibility.

Figure 6:
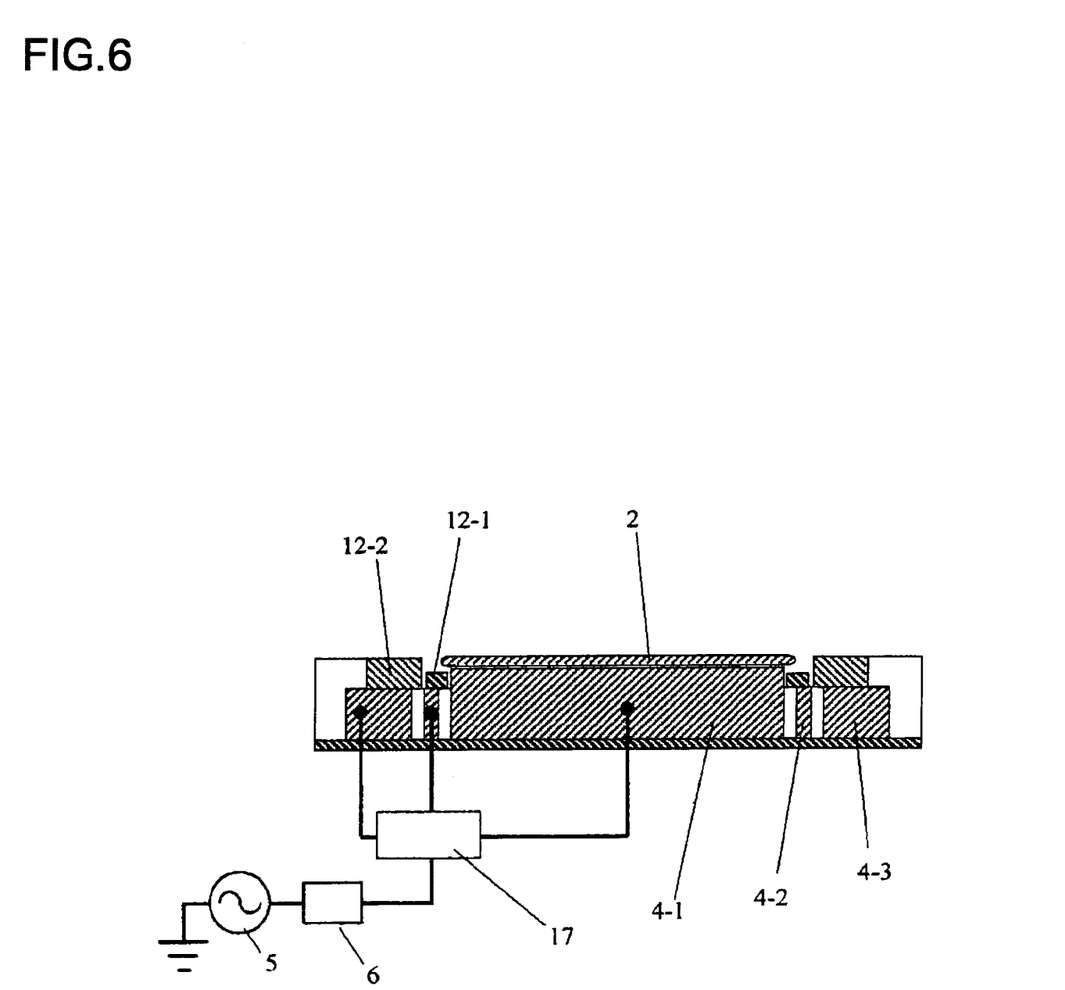
FIG. 6 is a schematic view of a plasma processing apparatus according to a third embodiment of the present invention.

FIG. 6 is a schematic view of a plasma processing apparatus according to a third embodiment of the present invention. In this embodiment, a focus ring 12 includes an inner focus subring 12-1 and an outer focus subring 12-2. The inner focus subring 12-1 is disposed directly under the outer edge of the backside of a specimen 2. The inner focus subring 12-1 and the outer focus subring 12-2 are placed on outer areas 4-2 and 4-3, respectively.

When the outer edge of the backside of a specimen 2 is cleaned, the electric power from a high-frequency power source 5 is divided into three portions with an electric power distributor 17: each portion is supplied to an inner area 4-1 and the outer areas 4-2 and 4-3. The electric power supplied to the inner area 4-1 and the outer areas 4-2 and 4-3 can be controlled independently.

The high-frequency electric power applied to the inner focus subring 12-1 through the outer area 4-2 can generate plasma predominantly directly under the outer edge of the backside of the specimen 2. Thus, even when the specimen 2 is not or slightly raised with a pusher pin, cleaning plasma can be generated along the outer edge of the backside of the specimen 2.

Figure 7:
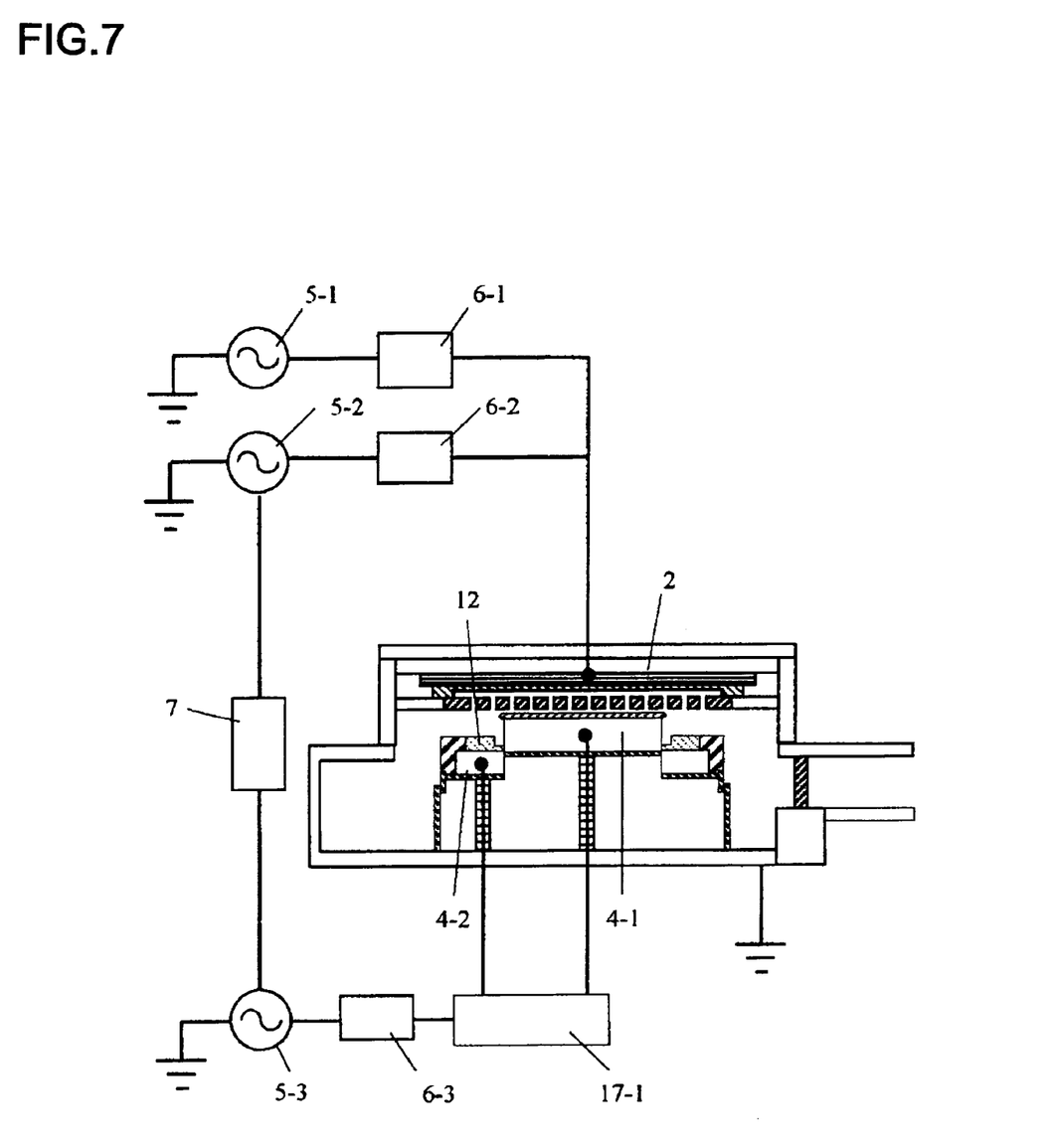
FIG. 7 is a schematic view of a plasma processing apparatus according to a fourth embodiment of the present invention.

FIG. 7 is a schematic view of a plasma processing apparatus according to a fourth embodiment of the present invention. In this embodiment, the height of a focus ring 12 can be adjusted relative to the height of a specimen 2 on an inner area 4-1. In other words, the height of an outer area 4-2 can be adjusted relative to the height of the inner area 4-1.

Thus, a distance required for the electric discharge between the outer edge of the backside of the specimen 2 and the focus ring 12 can be obtained even when the specimen 2 is not raised with the pusher pin. Hence, the outer edge of the backside of the specimen 2 can be cleaned even when the specimen 2 is not raised from the inner area 4-1. This prevents damage to a specimen-mounting face of the inner area 4-1 caused by cleaning plasma.

Figure 8:
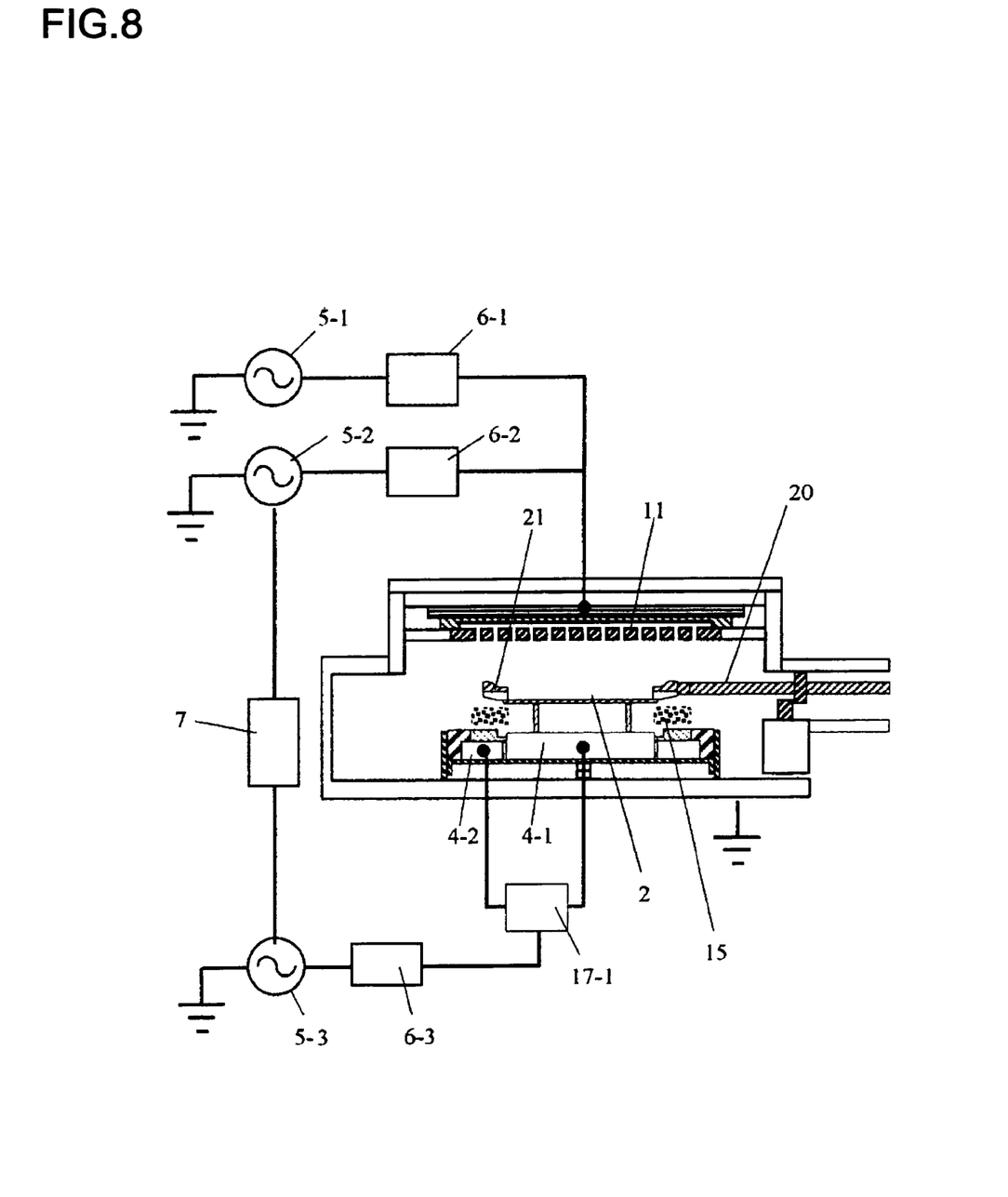
FIG. 8 is a schematic view of a plasma processing apparatus according to a fifth embodiment of the present invention.

FIG. 8 is a schematic view of a plasma processing apparatus according to a fifth embodiment of the present invention. In this embodiment, even when a mounting electrode 4 is not movable vertically, or even when the mounting electrode 4 or a pusher pin 8 moves too short a distance to bring a specimen 2 close to a shower plate 11, the front side of the specimen 2 can be protected during the cleaning of the outer edge of the backside of the specimen 2.

When plasma is generated along the outer edge of the backside of the specimen 2 while the front side of the specimen 2 is exposed, part of the plasma may reach the outer edge of the front side from the outer edge of the backside of the specimen 2, damaging the outer edge of the front side.

In the embodiment shown in FIG. 8, a carrier arm 20 for conveying a specimen 2 is provided with an arcuate carrier jig 21 at the tip. Changing the position of the carrier arm 20, raising the mounting electrode 4, or raising the specimen 2 with a pusher pin can bring the outer edge of the front side of the specimen 2 close to the arcuate carrier jig 21. This prevents the front side of the specimen 2 from being directly exposed to the plasma during the cleaning of the outer edge of the backside of the specimen 2.

Figure 9:
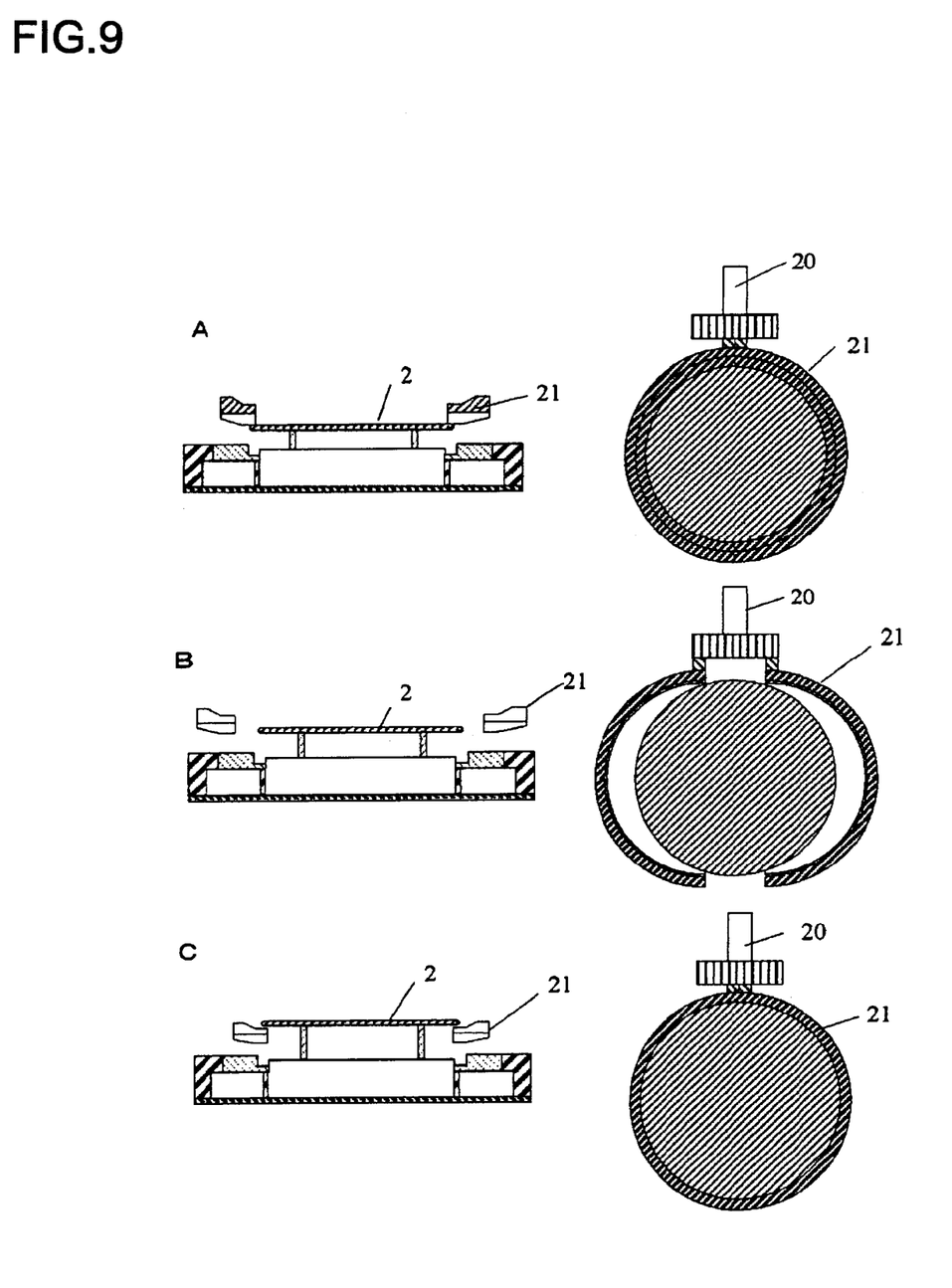
FIGS. 9A to 9C are detail views of an arcuate carrier jig.

FIGS. 9A to 9C are detail views of the arcuate carrier jig 21. FIG. 9A shows that the outer edge of the front side of the specimen 2 is protected with the arcuate carrier jig 21. FIG. 9B shows that the specimen 2 is being raised with a pusher pin to place the specimen 2 on the arcuate carrier jig 21 while the arcuate carrier jig 21 is opened not to hit the specimen 2. FIG. 9C shows that the specimen 2 is completely raised with the pusher pin, the arcuate carrier jig 21 is closed, and the specimen 2 is about to be placed on the arcuate carrier jig 21.

The arcuate carrier jig 21 is designed to split into at least two sections that can open and close. Thus, the specimen 2 can be placed on or removed from the arcuate carrier jig 21. In such a way, the carrier arm 20 having the arcuate carrier jig 21 can convey the specimen 2 and prevent damage to the outer edge of the front side of the specimen 2 caused by the plasma.

Figure 10:
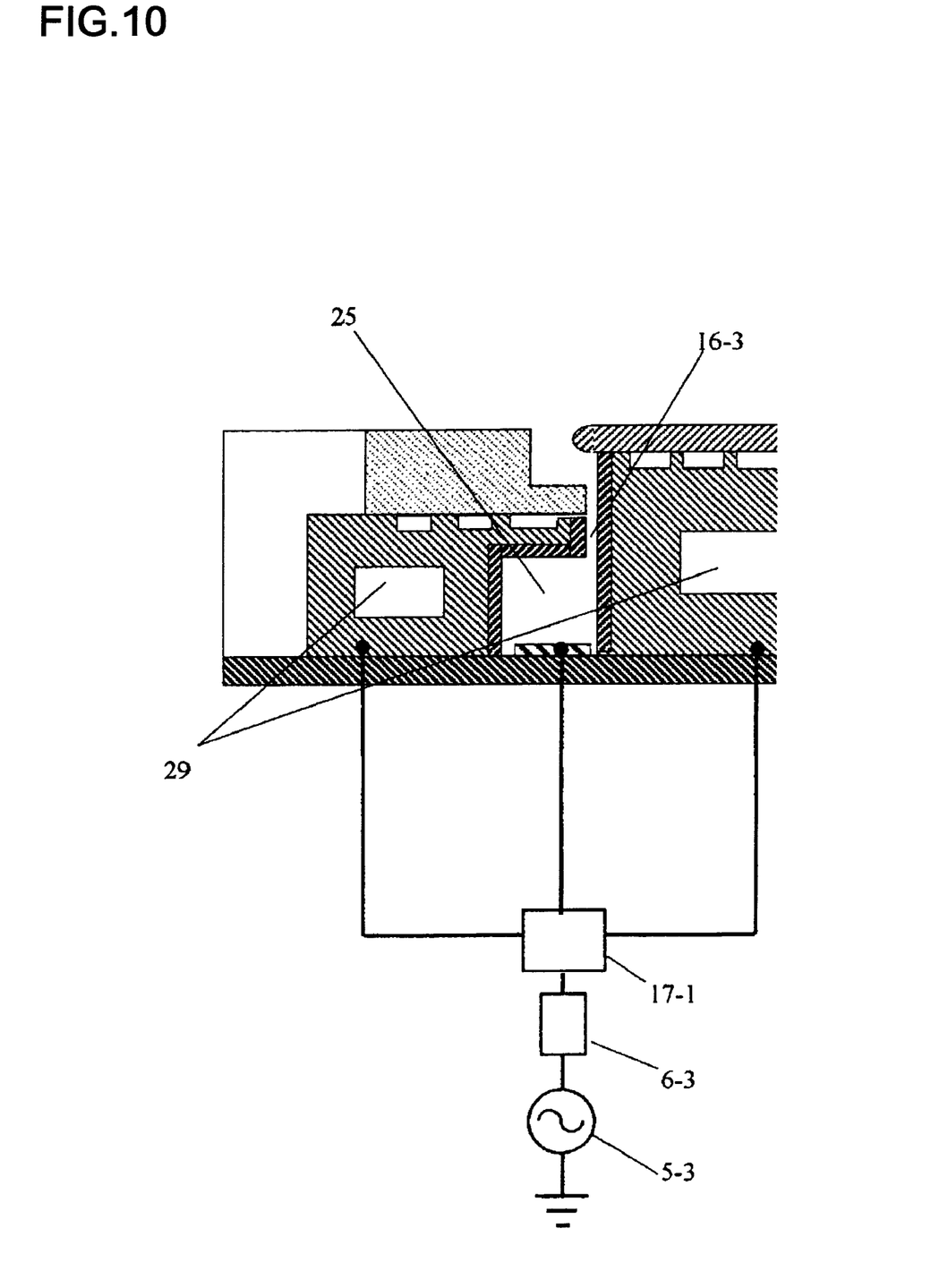
FIG. 10 is a schematic view of a plasma processing apparatus according to a sixth embodiment of the present invention.

FIG. 10 is a schematic view of a plasma processing apparatus according to a sixth embodiment of the present invention. In this embodiment, plasma similar to that generated along the outer edge of the backside of the specimen 2 as described in the first embodiment can be generated at a doughnut discharge space 25 in a mounting electrode 4. The doughnut discharge space 25 is in communication with a space over the mounting electrode 4 through a gap between an inner area 4-1 and an outer area 4-2 of the mounting electrode 4. Only reactive radicals generated in the plasma are supplied to the outer edge of the backside of the specimen 2 through the gap.

Examples of an electric discharge gas supplied to the gap include oxygen and nitrogen. In this case, oxygen radicals or nitrogen radicals are supplied to the outer edge of the backside of the specimen 2. In this embodiment, charged particles, such as electrons or ions, hardly diffuse into a processing chamber during the cleaning of the outer edge of the backside of the specimen 2. Thus, it is not necessary to bring the specimen 2 close to a shower plate, as shown in FIG. 1, or to provide an annular protector on the front side of the specimen 2, as shown in FIG. 8.

Figure 11:
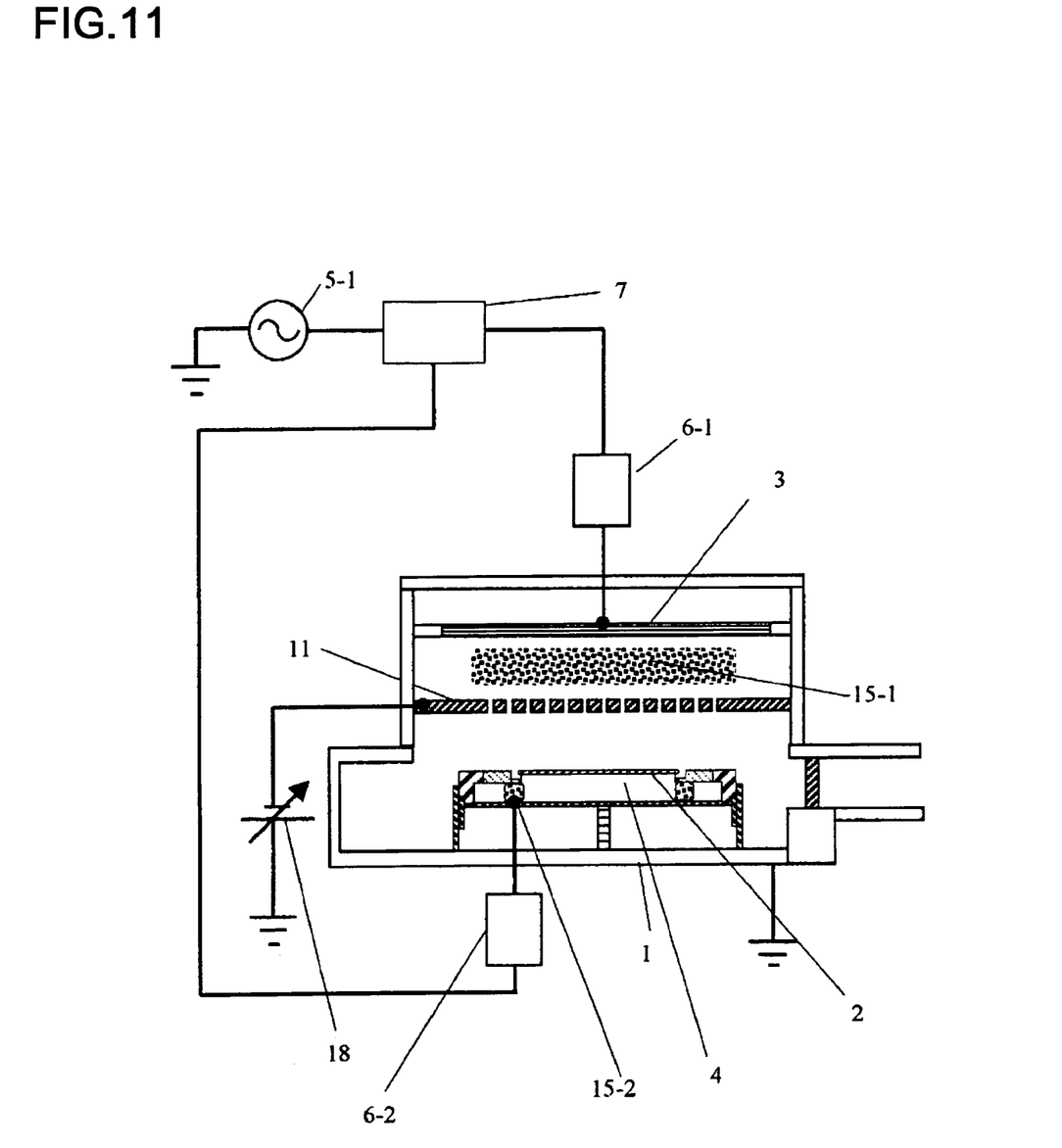
FIG. 11 is a schematic view of a remote plasma processing apparatus to which a plasma processing apparatus according to an embodiment of the present invention is applied.

FIG. 11 is a schematic view of a remote plasma processing apparatus to which a plasma processing apparatus according to an embodiment of the present invention is applied.

In this remote plasma processing apparatus, a shower plate 11 between plasma 15-1 generated under an antenna electrode 3 and a specimen 2 can prevent the plasma 15-1 from reaching the specimen 2. The shower plate 11 has a lot of holes. Charged particles are neutralized through the holes in the shower plate 11 and are discharged downward. The discharged neutral particles are used for predetermined processing, such as etching or ashing, of the specimen 2.

The energy of the neutral particles incident on the specimen 2 can be controlled by the voltage of a direct-current power source 18 connected to the shower plate 11, when the shower plate 11 is made of an electrically conductive material. The shower plate 11 may be made of silicon or aluminum. The shower plate 11 may also be made of quartz, although the energy of the neutral particles is difficult to control in this case.

Such a remote plasma processing apparatus can be used when a specimen that is easily damaged by plasma is subjected to etching or ashing. When such a remote plasma processing apparatus is used to remove a deposited film on the outer edge of the backside of the specimen 2, plasma 15-2 is generated in a mounting electrode 4 for cleaning, and only neutral particles are supplied to the outer edge of the backside of the specimen 2. This allows the deposited film to be removed from the outer edge of the backside of the specimen 2 without damaging the front side of the specimen.

Thus, according to this embodiment, the cleaning plasma generated between the outer edge of the backside of the specimen 2 and the mounting electrode 4 can remove the deposit on the outer edge of the backside of the specimen 2.

What is claimed is:

1. A plasma processing apparatus comprising:
a vacuum processing chamber;
supplying means for introducing a processing gas into the vacuum processing chamber;
a mounting electrode in the vacuum processing chamber for mounting a specimen on the mounting electrode;
a focus ring; and
a pusher pin for raising the specimen placed on the mounting electrode and holding the specimen over the mounting electrode;
wherein the mounting electrode is divided into an inner area for mounting the specimen, and an outer area for mounting the focus ring, the inner area and the outer area of the mounting electrode being electrically insulated from one another;
wherein a high-frequency power source is provided for supplying electric power to the inner area and the outer area;
wherein high-frequency electric power is applied to the outer area of the mounting electrode to generate plasma at the outer edge of the backside of the specimen while the specimen is raised with the pusher pin; and
wherein a focus-ring-mounting face of the outer area is provided with a passage for discharging a coolant of the focus ring from the inner edge side of the focus ring to the inner area for mounting the specimen.

2. A plasma processing apparatus comprising:
a vacuum processing chamber;
supplying means for introducing a processing gas into the vacuum processing chamber;
a mounting electrode in the vacuum processing chamber for mounting a specimen on the mounting electrode;
a focus ring; and
a pusher pin for raising the specimen placed on the mounting electrode and holding the specimen over the mounting electrode;
wherein the mounting electrode is divided into an inner area for mounting the specimen, and an outer area for mounting the focus ring, the inner area and the outer area of the mounting electrode being electrically insulated from one another;
wherein a high-frequency power source is provided for supplying electric power to the inner area and the outer area;
wherein high-frequency electric power is applied to the outer area of the mounting electrode to generate plasma at the outer edge of the backside of the specimen while the specimen is raised with the pusher pin; and wherein the inner area for mounting the specimen and the outer area for mounting the focus ring are independently provided with respective power supplies for supplying DC electric power for electrostatic chuck.

3. A plasma processing apparatus comprising:

a vacuum processing chamber;

supplying means for introducing a processing gas into the vacuum processing chamber;

a mounting electrode in the vacuum processing chamber for mounting a specimen on the mounting electrode;

a focus ring; and a pusher pin for raising the specimen placed on the mounting electrode and holding the specimen over the mounting electrode;

wherein the mounting electrode is divided into an inner area for mounting the specimen, and an outer area for mounting the focus ring, the inner area and the outer area of the mounting electrode being electrically insulated from one another;

wherein a high-frequency power source is provided for supplying electric power to the inner area and the outer area;

wherein high-frequency electric power is applied to the outer area of the mounting electrode to generate plasma at the outer edge of the backside of the specimen while the specimen is raised with the pusher pin; and wherein the focus ring is divided into an inner focus subring and an outer focus subring, and further comprising a high-frequency power source for supplying electric power independently to the inner focus subring and the outer focus subring of the focus ring.

4. A plasma processing apparatus comprising:

a vacuum processing chamber;

supplying means for introducing a processing gas into the vacuum processing chamber;

a mounting electrode in the vacuum processing chamber for mounting a specimen on the mounting electrode;

a focus ring; and a pusher pin for raising the specimen placed on the mounting electrode and holding the specimen over the mounting electrode;

wherein the mounting electrode is divided into an inner area for mounting the specimen, and an outer area for mounting the focus ring, the inner area and the outer area of the mounting electrode being electrically insulated from one another;

wherein a high-frequency power source is provided for supplying electric power to the inner area and the outer area;

wherein high-frequency electric power is applied to the outer area of the mounting electrode to generate plasma at the outer edge of the backside of the specimen while the specimen is raised with the pusher pin; and further comprising gas passages for supplying a gas independently to the inner area for mounting the specimen, the outer area for mounting the focus ring, and between the inner area and the outer area.

5. A plasma processing apparatus comprising:

a vacuum processing chamber;

supplying means for introducing a processing gas into the vacuum processing chamber;

a mounting electrode in the vacuum processing chamber for mounting a specimen on the mounting electrode;

a focus ring; and a pusher pin for raising the specimen placed on the mounting electrode and holding the specimen over the mounting electrode;

wherein the mounting electrode is divided into an inner area for mounting the specimen, and an outer area for mounting the focus ring, the inner area and the outer area of the mountinq electrode being electrically insulated from one another;

wherein a high-frequency power source is provided for supplying electric power to the inner area and the outer area;

wherein high-frequency electric power is applied to the outer area of the mounting electrode to generate plasma at the outer edge of the backside of the specimen while the specimen is raised with the pusher pin; and wherein high-frequency electric power applied to the outer area of the mounting electrode is independently controlled with respect to high-frequency electric power applied to the inner area of the mounting electrode.

6. A plasma processing apparatus comprising:

a vacuum processing chamber;

supplying means for introducing a processing gas into the vacuum processing chamber;

an antenna electrode for applying high-frequency electric power to the introduced processing gas to generate plasma;

a mounting electrode in the vacuum processing chamber for mounting a specimen on the mounting electrode;

a focus electrode; and a pusher pin for raising the specimen placed on the mounting electrode and holding the specimen over the mounting electrode;

wherein the mounting electrode is divided into an inner area for mounting the specimen, and an outer area for mounting the focus electrode, the inner area and the outer area of the mounting electrode being electrically insulated from one another;

wherein a high-frequency power source is provided for supplying electric power to the inner area and the outer area;

wherein high-frequency electric power is applied to the outer area of the mounting electrode to generate plasma at the outer edge of the backside of the specimen while the specimen is raised with the pusher pin; and wherein a focus-electrode-mounting face of the outer area is provided with a passage for discharging a coolant of the focus electrode from the inner edge side of the focus ring to the inner area for mounting the specimen.

7. A plasma processing apparatus comprising:

a vacuum processing chamber;

supplying means for introducing a processing gas into the vacuum processing chamber;

an antenna electrode for applying high-frequency electric power to the introduced processing gas to generate plasma;

a mounting electrode in the vacuum processing chamber for mounting a specimen on the mounting electrode;

a focus electrode; and a pusher pin for raising the specimen placed on the mounting electrode and holding the specimen over the mounting electrode;

wherein the mounting electrode is divided into an inner area for mounting the specimen, and an outer area for mounting the focus electrode, the inner area and the outer area of the mounting electrode being electrically insulated from one another;

wherein a high-frequency power source is provided for supplying electric power to the inner area and the outer area;

wherein high-frequency electric power is applied to the outer area of the mounting electrode to generate plasma at the outer edge of the backside of the specimen while the specimen is raised with the pusher pin; and wherein the inner area for mounting the specimen and the outer area for mounting the focus electrode are independently provided with respective power supplies for supplying DC electric power for electrostatic chuck.

8. A plasma processing apparatus comprising:

a vacuum processing chamber;

supplying means for introducing a processing gas into the vacuum processing chamber;

an antenna electrode for applying high-frequency electric power to the introduced processing gas to generate plasma;

a mounting electrode in the vacuum processing chamber for mounting a specimen on the mounting electrode;

a focus electrode; and a pusher pin for raising the specimen placed on the mounting electrode and holding the specimen over the mounting electrode;

wherein the mounting electrode is divided into an inner area for mounting the specimen, and an outer area for mounting the focus electrode, the inner area and the outer area of the mounting electrode being electrically insulated from one another;

wherein a high-frequency power source is provided for supplying electric power to the inner area and the outer area;

wherein high-frequency electric power is applied to the outer area of the mounting electrode to generate plasma at the outer edge of the backside of the specimen while the specimen is raised with the pusher pin; and wherein the focus electrode is divided into an inner focus sub-electrode and an outer focus sub-electrode, and further comprising a high-frequency power source for supplying electric power independently to the inner focus sub-electrode and the outer focus sub-electrode of the focus electrode.

9. A plasma processing apparatus comprising:

a vacuum processing chamber;

supplying means for introducing a processing gas into the vacuum processing chamber;

an antenna electrode for applying high-frequency electric power to the introduced processing gas to generate plasma;

a mounting electrode in the vacuum processing chamber for mounting a specimen on the mounting electrode;

a focus electrode; and a pusher pin for raising the specimen placed on the mounting electrode and holding the specimen over the mounting electrode;

wherein the mounting electrode is divided into an inner area for mounting the specimen, and an outer area for mounting the focus electrode, the inner area and the outer area of the mounting electrode being electrically insulated from one another;

wherein a high-frequency power source is provided for supplying electric power to the inner area and the outer area;

wherein high-frequency electric power is applied to the outer area of the mounting electrode to generate plasma at the outer edge of the backside of the specimen while the specimen is raised with the pusher pin; and wherein gas passages are provided for supplying a gas independently to the inner area for mounting the specimen, the outer area for mounting the focus electrode, and between the inner area and the outer area.

10. A plasma processing apparatus comprising:

a vacuum processing chamber;

supplying means for introducing a processing gas into the vacuum processing chamber;

an antenna electrode for applying high-frequency electric power to the introduced processing gas to generate plasma;

a mounting electrode in the vacuum processing chamber for mounting a specimen on the mounting electrode;

a focus electrode; and a pusher pin for raising the specimen placed on the mounting electrode and holding the specimen over the mounting electrode;

wherein the mounting electrode is divided into an inner area for mounting the specimen, and an outer area for mounting the focus electrode, the inner area and the outer area of the mounting electrode being electrically insulated from one another;

wherein a high-frequency power source is provided for supplying electric power to the inner area and the outer area;

wherein high-frequency electric power is applied to the outer area of the mounting electrode to generate plasma at the outer edge of the backside of the specimen while the specimen is raised with the pusher pin; and wherein high-frequency electric power applied to the outer area of the mounting electrode is independently controlled with respect to high-frequency electric power applied to the inner area of the mounting electrode.

11. The plasma processing apparatus according to claim 1,2,3,4,5,6,7,8,9 or 10, further comprising a mechanism for controlling the height of the focus ring relative to a specimen-mounting face of the inner area for mounting the specimen of the mounting electrode.

12. The plasma processing apparatus according to claim 6,7,8,9 or 10, wherein the height of the mounting electrode and the moving distance of the pusher pin are independently controllable, and the distance between the specimen and the antenna electrode and the distance between the mounting electrode and the specimen are controllable.

* * * * *